(12) United States Patent
Lin et al.

(10) Patent No.: US 8,710,908 B2
(45) Date of Patent: Apr. 29, 2014

(54) CHARGE PUMP AND METHOD OF BIASING DEEP N-WELL IN CHARGE PUMP

(75) Inventors: Yvonne Lin, Saratoga, CA (US); Tien-Chun Yang, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 81 days.

(21) Appl. No.: 13/015,906

(22) Filed: Jan. 28, 2011

(65) Prior Publication Data
US 2012/0194263 A1 Aug. 2, 2012

(51) Int. Cl.
*G05F 1/10* (2006.01)

(52) U.S. Cl.
USPC .............................................. 327/536; 363/60

(58) Field of Classification Search
USPC ........................ 327/536; 363/59–60
See application file for complete search history.

(56) References Cited

U.S. PATENT DOCUMENTS

| | | | | |
|---|---|---|---|---|
| 5,479,132 | A * | 12/1995 | Verhaeghe et al. | 327/553 |
| 5,751,142 | A * | 5/1998 | Dosho et al. | 323/316 |
| 5,812,018 | A * | 9/1998 | Sudo et al. | 327/537 |
| 5,907,484 | A * | 5/1999 | Kowshik et al. | 363/60 |
| 5,982,224 | A * | 11/1999 | Chung et al. | 327/536 |
| 5,986,947 | A | 11/1999 | Choi et al. | |
| 6,023,188 | A * | 2/2000 | Lee et al. | 327/536 |
| 6,100,557 | A * | 8/2000 | Hung et al. | 257/299 |
| 6,121,821 | A * | 9/2000 | Miki | 327/536 |
| 6,181,602 | B1 * | 1/2001 | Campardo et al. | 365/185.21 |
| 6,184,741 | B1 * | 2/2001 | Ghilardelli et al. | 327/536 |
| 6,285,240 | B1 * | 9/2001 | Shiau et al. | 327/536 |
| 6,323,522 | B1 * | 11/2001 | Hargrove et al. | 257/347 |
| 6,359,814 | B1 * | 3/2002 | Sundaram et al. | 365/189.09 |
| 6,418,040 | B1 * | 7/2002 | Meng | 363/60 |
| 6,448,842 | B2 * | 9/2002 | Zanuccoli et al. | 327/536 |
| 6,538,930 | B2 * | 3/2003 | Ishii et al. | 365/189.09 |
| 6,686,793 | B2 * | 2/2004 | Li | 327/536 |
| 6,914,791 | B1 * | 7/2005 | Park et al. | 363/60 |
| 7,190,211 | B2 * | 3/2007 | Nakagawa et al. | 327/536 |
| 7,256,438 | B2 * | 8/2007 | Shor et al. | 257/299 |
| 7,342,438 | B2 * | 3/2008 | Muneer et al. | 327/536 |
| 2007/0040599 | A1 * | 2/2007 | Sato | 327/536 |
| 2009/0174470 | A1 * | 7/2009 | Tseng | 327/546 |

OTHER PUBLICATIONS

Choi, Ki-Hwan et al., "Floating-Well Charge Pump Circuits for Sub-2.0V Single Power Supply Flash Memories", Symposium on VLSI Circuits Digest of Technical Papers, 1997, pp. 61-62.

* cited by examiner

*Primary Examiner* — Thomas J Hiltunen

(74) *Attorney, Agent, or Firm* — Lowe Hauptman & Ham, LLP

(57) ABSTRACT

A charge pump has at least one charge pump stage. Each charge pump stage includes at least one NMOS device. The at least one NMOS device has a deep N-well (DNW), and is coupled to at least one capacitor, an input node, and an output node. The input node is arranged to receive an input signal. The at least one capacitor is arranged to store electrical charges. The charge pump stage is configured to supply the electrical charges to the output node, and the DNW is arranged to float for a positive pump operation.

23 Claims, 5 Drawing Sheets

US 8,710,908 B2

CHARGE PUMP AND METHOD OF BIASING DEEP N-WELL IN CHARGE PUMP

TECHNICAL FIELD

The present disclosure relates generally to an integrated circuit and, more particularly, to a charge pump.

BACKGROUND

A charge pump is a kind of DC to DC converter that uses capacitors as energy storage elements to create either a higher (positive pump) or lower (negative pump) voltage power source. The charge pump can be used, for example, in a flash memory, where the charge pump provides a higher or lower voltage than a power supply voltage. In a charge pump that is used as both a positive pump and a negative pump, there are potential problems of activating a parasitic PN-junction or transistor structure when a bias voltage is changed for a desired operation.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable concepts that can be embodied in a wide variety of specific contexts. The specific embodiments discussed are merely illustrative of specific ways to make and use, and do not limit the scope of the disclosure.

Figure 1:
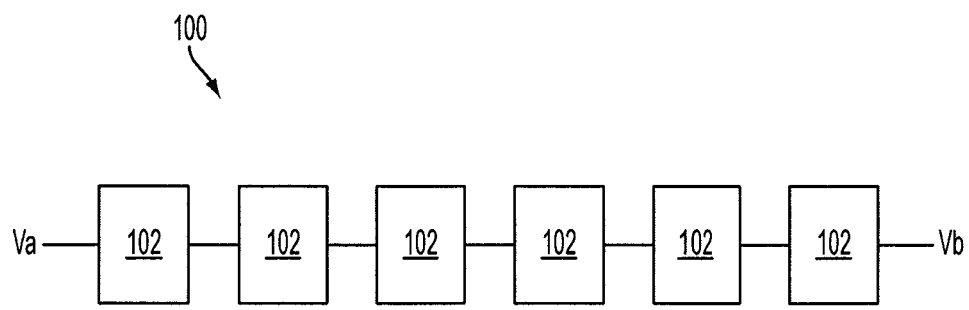
FIG. 1 is a schematic diagram showing an exemplary charge pump structure according to some embodiments.

FIG. 1 is a schematic diagram showing an exemplary charge pump structure according to some embodiments. The charge pump structure 100 includes multiple charge pump stages 102. The voltage Va and the voltage Vb depend on the power supply voltage and whether the charge pump structure 100 is used for a positive pump operation or a negative pump operation. For example, Vb can be higher than Va. For a positive pump operation, Va can be an input and Vb can be an output. Or for a negative pump operation, Va can be an output and Vb can be an input.

Figure 2A:
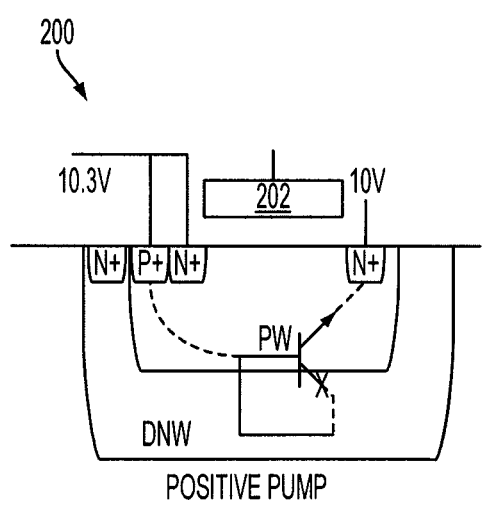
FIG. 2A is a schematic diagram showing an exemplary deep N-well biasing scheme for a positive pump operation according to some embodiments.

The charge pump stages 102 can be used for a positive pump operation or a negative pump operation for a flexible operation of the charge pump structure 100. For the flexible operation, each charge pump stage 102 should be biased with appropriate voltage levels such that a parasitic PN junction or transistor is not turned on when a bias voltage is changed for a desired operation. The biasing scheme for an NMOS device having a deep N-well (DNW) in the charge pump stage 102 (NPump) is described below. FIG. 2A is a schematic diagram showing an exemplary deep N-well biasing scheme for an NMOS device in the exemplary charge pump stage 102 in FIG. 1 for a positive pump operation according to some embodiments. A gate 202 is formed above a P-well (PW). In this example, the source (N+ region) and the P-well (PW, P+ region) of the NMOS device 200 are biased at 10.3 V, while the drain (N+ region) of the NMOS device is biased at 10 V. For the positive pump operation, DNW is floated and thus has almost the same voltage level as the adjoining P-well PW. Therefore, the parasitic PN junction of PW and DNW is turned off.

Figure 2B:
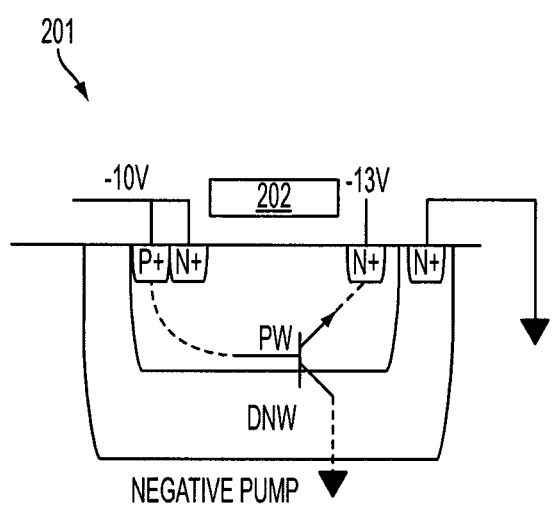
FIG. 2B is a schematic diagram showing an exemplary deep N-well biasing scheme for a negative pump operation according to some embodiments.

FIG. 2B is a schematic diagram showing an exemplary deep N-well biasing scheme for an NMOS device 201 in the exemplary charge pump stage in FIG. 1 for a negative pump operation according to some embodiments. In this example, the source (N+ region) and the PW (P+ region) of the NMOS device 201 are biased at −10 V, while the drain (N+ region) of the NMOS device is biased at −13 V. For the negative pump operation, DNW is coupled to the ground, and thus has a 0 V. Therefore, the parasitic PN junction of PW and DNW is reverse-biased and turned off.

Figure 3:
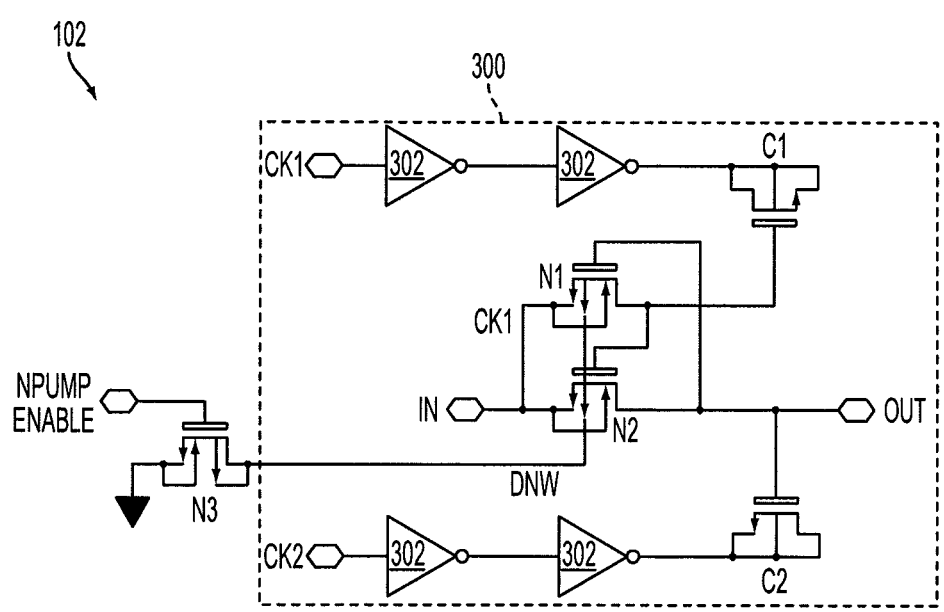
FIG. 3 is a schematic diagram showing an exemplary charge pump stage according to some embodiments.

FIG. 3 is a schematic diagram showing an exemplary charge pump stage 102 having the exemplary deep N-well biasing scheme in FIG. 2A and/or 2B according to some embodiments. The charge pump stage 102 in this example includes a 4-phase charge pump stage 300. Two clock signals CK1 and CK2 are coupled through buffers 302 to the capacitors C1 and C2, respectively. The capacitors C1 and C2 can be implemented with a PMOS or NMOS transistor with its source and drain coupled together, for example.

The NMOS devices N1 and N2, e.g., NMOS transistors, are coupled to the capacitors C1 and C2. An input node (In) and an output node (Out) are coupled to the NMOS devices N1 and N2. The NMOS switch N3 is coupled to a ground and the deep N-wells of the NMOS devices N1 and N2. The P-wells of the NMOS devices N1 and N2 are coupled to their respective sources. An NPump Enable signal refers to a signal for controlling the operation of the charge pump, i.e., the positive pump operation or the negative pump operation of the charge pump is determined in response to the NPump Enable signal. An NPump Enable signal is coupled to the gate of the NMOS switch N3. The P-well of the NMOS switch N3 is coupled to its source and the ground. The N-well of the NMOS switch N3 is coupled to its drain.

The 4-phase charge pump stage 300 and its operation are known in the art. (Even though there are two clock signals CK1 and CK2 for 4-phase charge pump stage 300, a neighboring 4-phase charge pump stage will have two different clock signals, e.g., CK3 and CK4, for the 4-phase charge pump operation.) For example, during a time period when CK1 is low (a logical 0) and CK2 is high (a logical 1), the capacitor C2 is charged (with electrical charges). Because CK2 is high, the gate voltage of the NMOS device N1 is high to turn it on. When the input voltage Vin is supplied to the input node (In), the Vin is coupled to the gate voltage of the NMOS device N2. Then when CK2 becomes low (a logical 0) and CK1 becomes high (a logical 1), the gate voltage of NMOS device N2 becomes higher to turn on the NMOS device N2 and electrical charges are supplied to the output node (Out) from which the output voltage Vout is output.

Depending on whether the 4-phase charge pump stage 300 is used for a positive or a negative pump operation, the DNW of NMOS devices N1 and N2 is floating, or coupled to the ground through the NMOS switch N3. The source and P-well of the NMOS switch N3 are coupled to the ground. For example, during a positive pump operation, the NMOS switch N3 is turned off by the NPump Enable signal at low (logical 0), thereby floating the DNW of NMOS devices N1 and N2. Floating of the DNW prevents the parasitic PN junction of DNW and PW from turning on as shown in FIG. 2A. During a negative pump operation, the NMOS switch N3 is turned on by the NPump Enable signal at high (logical 1), thereby coupling the DNW of NMOS devices N1 and N2 to the ground. Coupling the DNW to ground prevents the parasitic PN junction of DNW and PW from turning on as shown in FIG. 2B.

Even though the DNW biasing scheme in FIGS. 2A and 2B is shown for a charge pump stage 102 in FIG. 3 having a 4-phase charge pump stage 300, the DNW biasing scheme can also be implemented for other charge pump stages having a DNW, e.g., a 2-phase charge pump stage having a diode and a capacitor. In accordance with such an embodiment, the biasing scheme can be implemented for a charge pump stage having a DNW using a switch similar to the NMOS switch N3.

Figure 4:
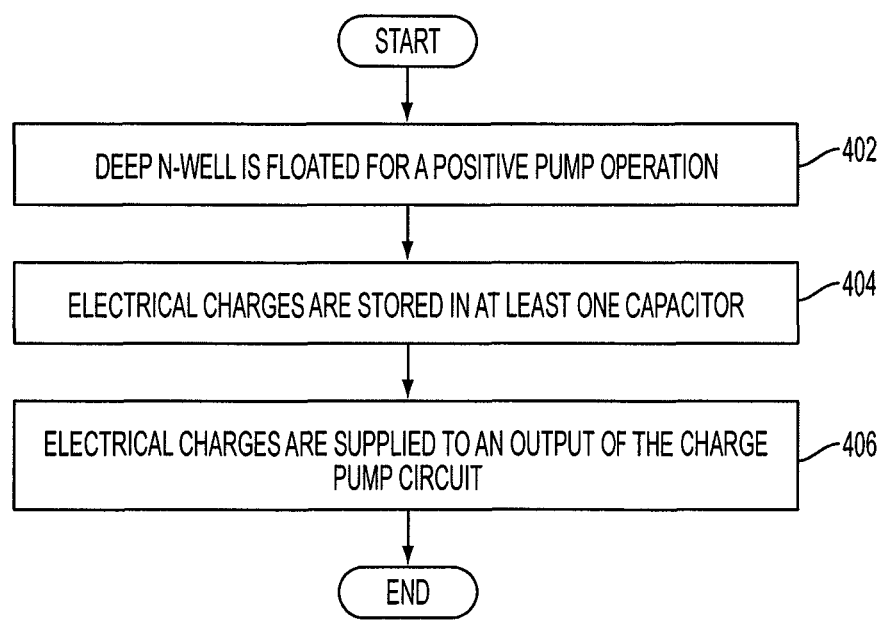
FIG. 4 is a flowchart of a method of the exemplary deep N-well biasing scheme in FIG. 2A, 2B and/or FIG. 3 for a charge pump according to some embodiments.

FIG. 4 is a flowchart of a method of the exemplary deep N-well biasing scheme in FIG. 2A, 2B, and/or FIG. 3 for a charge pump according to some embodiments. At step 402, the deep N-well is floated for a positive pump operation. At step 404, electrical charges are stored in at least one capacitor. At step 406, electrical charges are supplied to an output of the charge pump circuit.

In various embodiments, floating the deep N-well comprises turning off a switch coupled between the deep N-well and a ground. The P-well of the switch is coupled to the ground. The deep N-well is coupled to the ground for a negative pump operation. The deep N-well is coupled to a ground by turning on a switch coupled between the deep N-well and the ground.

According to some embodiments, a charge pump circuit has at least one charge pump stage. Each charge pump stage includes at least one NMOS device. The at least one NMOS device has a deep N-well (DNW) and is coupled to at least one capacitor, an input node, and an output node. The input node is arranged to receive an input signal. The at least one capacitor is arranged to store electrical charges. The charge pump stage is configured to supply electrical charges to the output node, and the DNW is arranged to float for a positive pump operation.

According to some embodiments, a method of biasing a deep N-well of at least one NMOS device coupled to at least one capacitor in the charge pump circuit includes floating the deep N-well for a positive pump operation. Electrical charges are stored in the at least one capacitor. Electrical charges are supplied to an output of the charge pump circuit.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A charge pump having at least one charge pump stage, each charge pump stage comprising:
    at least one NMOS device having a deep N-well (DNW), wherein a gate of the at least one NMOS device is capable of receiving a different signal from a drain of the at least one NMOS device;
    at least one capacitor coupled to the at least one NMOS device;
    a switch coupled between the at least one NMOS device and a ground, wherein a drain of the switch is coupled to a deep N-well of the switch;
    an input node coupled to the at least one NMOS device; and
    an output node coupled to the at least one NMOS device,
    wherein the input node is arranged to receive an input signal, the at least one capacitor is arranged to store electrical charges, the charge pump stage is configured to supply the electrical charges to the output node, and the DNW is arranged to float for a positive pump operation.

2. The charge pump of claim 1, wherein the DNW is arranged to be coupled to a ground for a negative pump operation.

3. The charge pump of claim 1, wherein the switch is arranged to be turned off for the positive pump operation.

4. The charge pump of claim 1, wherein the switch is arranged to be turned on for a negative pump operation.

5. The charge pump of claim 1, wherein the switch is an NMOS transistor.

6. The charge pump of claim 5, wherein a P-well of the switch is coupled to the ground.

7. The charge pump of claim 1, wherein the at least one NMOS device is an NMOS transistor.

8. The charge pump of claim 1, wherein the at least one capacitor is an NMOS transistor having a source and a drain coupled together.

9. The charge pump of claim 1, wherein the at least one NMOS device comprises two cross-latched NMOS devices, wherein the DNW of each of the two NMOS devices is electrically coupled to the switch.

10. The charge pump of claim 1, wherein the drain of the switch is coupled to the DNW of the at least one NMOS device.

11. A method of biasing a deep N-well of at least one NMOS device coupled to at least one capacitor in a charge pump circuit comprising:
    floating the deep N-well for a positive pump operation by turning off a switch coupled between the deep N-well and a ground, wherein a drain of the switch is coupled to a deep N-well of the switch;
    storing electrical charges in the at least one capacitor;
    supplying a signal to a gate of the at least one NMOS device different from a signal to a drain of the at least one NMOS device; and
    supplying the electrical charges to an output of the charge pump circuit.

12. The method of claim 11, further comprising coupling a P-well of the switch to the ground.

13. The method of claim 11, further comprising coupling the deep N-well to a ground for a negative pump operation.

14. The method of claim 13, wherein coupling the deep N-well to a ground comprises turning on a switch coupled between the deep N-well and the ground.

15. The method of claim 14, further comprising coupling a P-well of the switch to the ground.

16. A charge pump having at least one charge pump stage, each charge pump stage comprising:
- at least one NMOS device having a deep N-well (DNW), wherein a gate of the at least one NMOS device is capable of receiving a different signal from a drain of the at least one NMOS device;
- at least one capacitor coupled to the at least one NMOS device;
- an input node coupled to the at least one NMOS device;
- an output node coupled to the at least one NMOS device; and
- a switch coupled between the at least one NMOS device and a ground, wherein a drain of the switch is coupled to a deep N-well of the switch;
- wherein the input node is arranged to receive an input signal, the at least one capacitor is arranged to store electrical charges, the charge pump stage is configured to supply the electrical charges to the output node, the DNW is arranged to float for a positive pump operation, and the DNW is arranged to be coupled to a ground for a negative pump operation.

17. The charge pump of claim 16, wherein the at least one NMOS device comprises two cross-latched NMOS devices, wherein the DNW of each of the two NMOS devices is electrically coupled to the switch.

18. The method of claim 11, further comprising coupling the drain of the switch to the deep N-Well of the at least one NMOS device.

19. The charge pump of claim 16, wherein the switch is arranged to be turned off for the positive pump operation and to be turned on for the negative pump operation.

20. The charge pump of claim 16, wherein the switch is an NMOS transistor.

21. The charge pump of claim 16, wherein a P-well of the switch is coupled to the ground.

22. The charge pump of claim 16, wherein the at least one NMOS device is an NMOS transistor.

23. The charge pump of claim 16, wherein the drain of the switch is coupled to the DNW of the at least one NMOS device.

* * * * *